United States Patent
Wang et al.

(10) Patent No.: US 10,140,416 B2
(45) Date of Patent: Nov. 27, 2018

(54) PROCESS-ORIENTATED DESIGN METHOD FOR MACHINE TOOL STRUCTURES

(71) Applicant: INDUSTRIAL TECHNOLOGY RESEARCH INSTITUTE, Hsin-Chu (TW)

(72) Inventors: Chia-Pei Wang, Tainan (TW); Chien-Chih Liao, Taichung (TW); Pei-Yin Chen, Taichung (TW); Hsiao-Chen Ho, Taoyuan (TW); Tzuo-Liang Luo, Taichung (TW)

(73) Assignee: INDUSTRIAL TECHNOLOGY RESEARCH INSTITUTE, Hsin-Chu (TW)

( * ) Notice: Subject to any disclaimer, the term of this patent is extended or adjusted under 35 U.S.C. 154(b) by 313 days.

(21) Appl. No.: 14/965,040

(22) Filed: Dec. 10, 2015

(65) Prior Publication Data

US 2017/0068773 A1 Mar. 9, 2017

(30) Foreign Application Priority Data

Sep. 4, 2015 (TW) .............................. 104129392 A

(51) Int. Cl.
 *G06F 17/50* (2006.01)
 *G05B 19/4069* (2006.01)
(52) U.S. Cl.
 CPC ..... *G06F 17/5086* (2013.01); *G05B 19/4069* (2013.01)
(58) Field of Classification Search
 None
 See application file for complete search history.

(56) References Cited

U.S. PATENT DOCUMENTS 5,920,491 A 7/1999 Hibbitt et al.
6,810,302 B2 10/2004 Darcy, Jr.
(Continued)

FOREIGN PATENT DOCUMENTS

CN 102063540 A 5/2011
CN 102189441 A 9/2011
(Continued)

OTHER PUBLICATIONS

Y. Altintas et al., Virtual Design and Optimization of Machine Tool Spindles, CIRP Annals—Manufacturing Technology vol. 54, Issue 1, 2005, pp. 379-382.
(Continued)

*Primary Examiner* — Syed A Roni
(74) *Attorney, Agent, or Firm* — Locke Lord LLP; Tim Tingkang Xia, Esq.

(57) ABSTRACT

A process-orientated design method for machine tool structures comprises the steps of: (A) Defining design conditions including initial configurations, cutting requirements and boundary conditions for the machine tool; (B) Calculating cutting ability to generate information realizing a relationship between a maximum cutting depth and a spindle speed of the machine tool based on the initial configurations and the cutting requirements; (C) Performing an optimization to generate a frequency range for optimization based on the information relating the maximum cutting depth and the spindle speed; (D) Performing structural topology optimization to generate an optimized model based on the frequency range for optimization, the initial configurations and boundary conditions; and (E) Determining whether the optimized model fits the constraint condition; if positive, ends the design steps, and otherwise repeats steps (B)~(D) until an optimized model fits the constraint condition appears.

5 Claims, 3 Drawing Sheets

(56) References Cited

U.S. PATENT DOCUMENTS

| | | | |
|---|---|---|---|
| 6,962,245 B2 | 11/2005 | Ray et al. | |
| 7,024,343 B2 | 4/2006 | El-Ratal | |
| 7,255,191 B2 | 8/2007 | Baldwin et al. | |
| 7,933,679 B1* | 4/2011 | Kulkarni | G05B 13/0265 700/173 |
| 2007/0277609 A1* | 12/2007 | Schmitz | B23Q 17/0971 73/584 |
| 2013/0160619 A1 | 6/2013 | Lee | |

FOREIGN PATENT DOCUMENTS

| | | |
|---|---|---|
| CN | 102880766 A | 1/2013 |
| CN | 103336868 A | 10/2013 |
| CN | 104239624 A | 12/2014 |
| EP | 1213669 A2 | 6/2002 |
| JP | 05104396 | 4/1993 |
| KR | 20030028558 A | 4/2003 |
| KR | 100750006 | 8/2007 |
| TW | 514517 B | 12/2002 |
| TW | I409801 B | 9/2013 |
| TW | 201405263 A | 2/2014 |
| TW | I453557 B | 9/2014 |
| TW | I497242 B | 8/2015 |
| WO | 1993001537 A1 | 1/1993 |

OTHER PUBLICATIONS

Jang, H. H. et al. "Dynamic response topology optimization in the time domain using equivalent static loads" AIAA journal, 2011, 226-234.

Mohit Law e al., Rapid evaluation and optimization of machine tools with position-dependent stability, International Journal of Machine Tools and Manufacture, vol. 68, 2013, pp. 81-90.

H. Weule et al., Structural Optimization of Machine Tools including the Static and Dynamic Workspace Behavior, The 36 CIRP—International Seminar on Manufacturing Systems, 2003, Germany.

Z.-D. Ma et al., Structural topology and shape optimization for a frequency response problem, Computational Mechanics, 1993, vol. 13, Issue 3, pp. 157-174.

Niels Olhoff et al., Topological design of continuum structures subjected to forced vibration, 6th World Congress of Structural and Multidisciplinary Optimization, 2005, Brazil.

Jakob S. Jensen, Topology optimization of dynamics problems with Padé pproximants, International Journal for Numerical Methods in Engineering, 2007, 72(13):1605-1630.

* cited by examiner

PROCESS-ORIENTATED DESIGN METHOD FOR MACHINE TOOL STRUCTURES

CROSS REFERENCE TO RELATED APPLICATION

The present application is based on, and claims priority from, Taiwan (International) Application Serial Number 104129392, filed on Sep. 4, 2015, the disclosure of which is hereby incorporated by reference herein in its entirety.

TECHNICAL FIELD

The present disclosure relates to a process-orientated design method for machine tool structures, and more particularly to a process-orientated design method for machine tool structures that can adjust machine's machinability, minimize possible design change and reduce required design time in the early initial design stage of the machine tool.

BACKGROUND

The technique of performing a structural topology optimization was introduced in the early 1990s. Since then, after 10 more years of development, this technique has gradually become mature. Major differences between this structural topology optimization technique and the conventional structural shape parametric optimization are that the structural topology optimization technique can greatly enhance the structural performance and significantly change the shape. Broadly speaking, in a new design process of a machinery product, the initial step would be to introduce the technique of structural topology optimization to obtain an initial shape of the structure, then the optimization in shape and structural parameters would be applied to further modify detail scales, and thus an optimal structure for the machinery product can be reached.

Recently, people in designing machine tools have gradually tried to organize an initial structural configuration of a machine tool by performing the structural topology optimization. For example, in one of early applications, a typical task for minimizing the static compliance is executed by assuming the forcing on the structure is a static force. However, it is well known that the forcing on the tooling is always a dynamic force, or say an oscillating force. The assumption of static forcing in minimizing the static compliance can never be mapped to a dynamic response of the structure under oscillating forcing. Hence, researchers proposed to include a constraint condition of the nature frequency for better adjusting the structural dynamic characteristics. Moreover, a new assumption of treating the cutting force as a harmonic force was applied to achieve the dynamic compliance frequency response minimization. By providing the aforesaid design efforts, the static/dynamic stiffness of the design structure of the machine tool can be successfully improved. However, to the majority users of the machine tool, the static/dynamic stiffness is simple a relative abstract index that could probably means anything. It can be understood that the user of the machine tool expects to be taught if or not the machinability of the machine tool can meet his/her work requirement. Namely, the current structural topology optimization cannot provide a clear relationship between the structural characteristics (including static stiffness, nature frequency, dynamic stiffness and so on) and the machinability (including the maximum cutting depth and the like), and thus cannot directly perform the optimization upon the expected machinability of the machine tool.

On the other hand, the chatter analysis method in cutting is to transfer structural characteristics of the machine tool into cutting ability of the machine tool, so that a relationship between the structural characteristics and the cutting ability can be established. However, even though the conventional chatter analysis method in cutting can provide a meaningful relationship in between, the technique regarding how to improve the structure so as to upgrade the cutting ability is still yet to be developed. Further, in another effort, a technique that integrates the static stiffness topology optimization and the prediction of the cutting ability is actual an optimization process in static stiffness, not aimed to optimize the cutting ability. In particular, in this technique, the prediction of the cutting ability is appropriate to be executed after completion of the whole design process, and is simple for evaluation and prediction only.

From all the aforesaid techniques, since practical cutting action of the machine tool is dynamic, not static, thus the conventional efforts of applying structural topology optimization upon machine tools are restricted to analysis in static stiffness. The structural frequency response optimization for the cutting in a dynamic approach is yet to be achieved. Even that the structural topology optimization upon the dynamic stiffness of the machine tool structure can be introduced to improve the dynamic stiffness, following two problems are yet to be overcome.

(1) To designs, the optimized structure is still hard to be determined, and it is still in vague if the machinability can meet the designer's manufacturing requirements.

(2) Generally, a normal process for the structural topology optimization would never be applied to the amplitude with a negative real part. However, it is understood that the performance in cutting depth under chatter limits is highly related to that amplitude with a negative real part, and is unrelated to the amplitudes in other frequency domain.

In addition, if a cutting simulation for determining the machinability is performed after the design process of the machine tool structure is over, plenty of time would be wasted in repeating the modification of the structure if lack of machinability is found in the simulation.

Hence, if, in the early design stage of performing a structural topology optimization, the machinability is already raised as the topic of the design, then less error trials would be encountered in the following design process, and thus the design cycle would be greatly reduced.

SUMMARY

Accordingly, in one embodiment of this disclosure, a process-orientated design method for machine tool structures comprises the steps of:

(A) Defining design conditions, in which the design conditions include initial configurations for a machine tool, cutting requirements of the machine tool and boundary conditions of the machine tool;

(B) Calculating cutting ability, based on the initial configurations and the cutting requirements of Step (A) to generate information of the machine tool that characterizes a relationship between a maximum cutting depth and a spindle speed of the machine tool;

(C) Performing an optimization, based on the information of Step (B) to determine a frequency range for the optimization;

(D) Performing a structural topology optimization, based on the frequency range of Step (C) and the initial configurations and the boundary conditions of Step (A) to generate an optimized model; and (E) Determining whether the optimized model fits the constraint condition, ending the method if the optimized model of Step (D) fits the constraint condition, repeating Steps (B)~(D) till an optimized model satisfying the constraint condition of Step (A) is obtained (iterative for-loop design)if the optimized model does not fit the constraint condition of Step (A).

Further scope of applicability of the present application will become more apparent from the detailed description given hereinafter. However, it should be understood that the detailed description and specific examples, while indicating exemplary embodiments of the disclosure, are given by way of illustration only, since various changes and modifications within the spirit and scope of the disclosure will become apparent to those skilled in the art from this detailed description.

BRIEF DESCRIPTION OF THE DRAWINGS

The present disclosure will become more fully understood from the detailed description given hereinbelow and the accompanying drawings which are given by way of illustration only, and thus are not limitative of the present disclosure and wherein.

DETAILED DESCRIPTION

Figure 1:
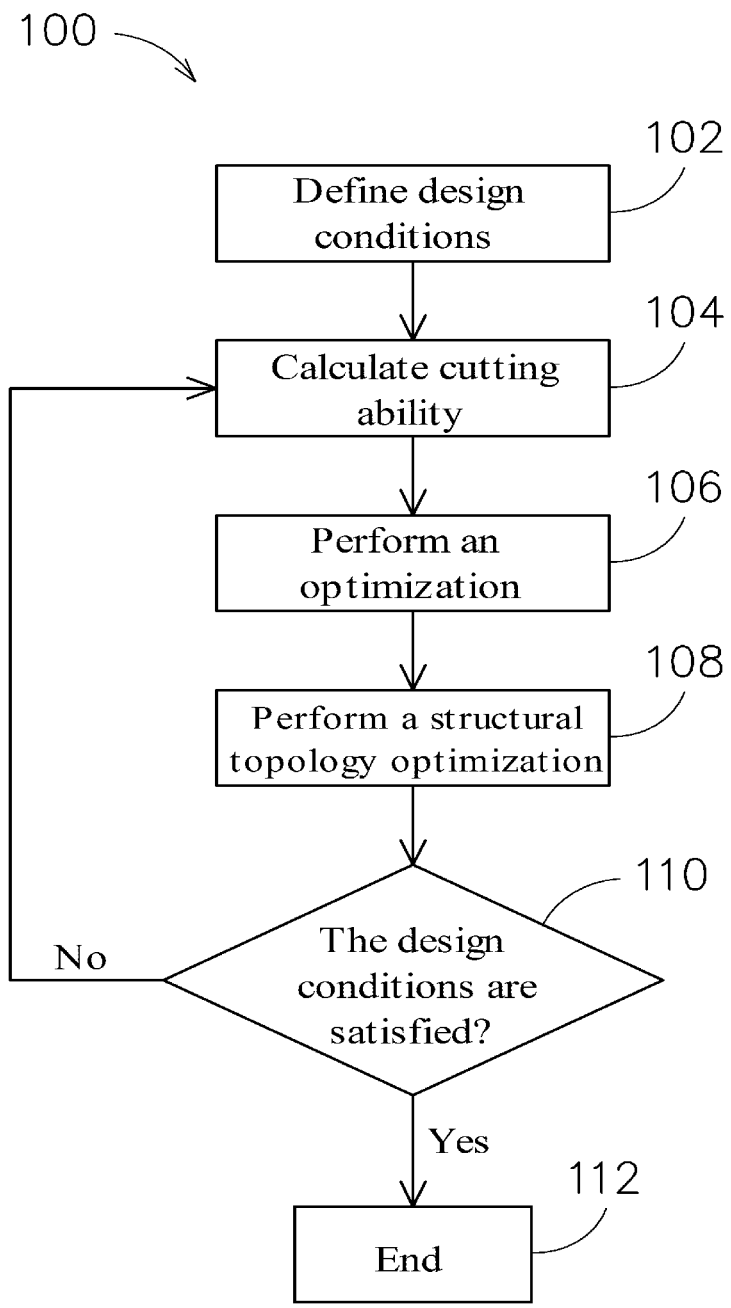
FIG. 1 is a flowchart of one embodiment of the process-orientated design method for machine tool structures in accordance with the present disclosure.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

Referring now to FIG. 1, the process-orientated design method for machine tool structure 100 in this disclosure includes the following steps.

Step 102: Define design conditions. In this disclosure, the design conditions may include mainly initial configurations, cutting requirements and boundary conditions. The design conditions defined in Step 102 can further include an optimized model and a constraint condition. One of the optimized model and the constraint condition includes a maximum stable cutting depth of the machine tool under a specific spindle speed or a specific range of the spindle speed, while another one of the optimized model and the constraint condition includes a structural weight of the machine tool.

The object of Step 102 is to define major conditions for designing the machine tool; for example, but not limited to, define one cutting requirement to be a 4-blade plain cutter with a 30-mm diameter, to define the work piece to be an AL-7050, to define an optimal constraint condition to be a 25% of the structural weight, to define the optimized model to maximize the lowest cutting depth under a cutting speed within 0~10000 rpm and so on. To different designs for various machine tools, different design conditions can be provided as, but not limited to, the aforesaid typical conditions.

The constraint condition defined in Step 102 might be various. For example, the optimized model can be to minimize the structural mass accompanied by a constraint condition of a steady-state cutting depth, or the optimized model is to maximize the steady-state cutting accompanied by a constraint condition of a desired structural weight.

Step 104: Calculate cutting ability. Based on the initial configurations and the cutting requirements defined in Step 102 for the machine tool, information of the machine tool is generated to realize a relationship between the maximum cutting depth and the spindle speed of machine tool. The information of the machine tool that reveals the relationship between the maximum cutting depth and the spindle speed of the machine tool can be provided in a steady-state cutting diagram, namely a plot to symbolize the cutting ability of the designed machine tool ≥ cutting ability. Atypical steady-state cutting diagram is shown in FIG. 2, which is obtained from an embodiment with the design conditions described in the foregoing Step 102 for the 4-blade plain cutter.

Step 106: Perform an Optimization. Base on the information of the machine tool that reveals the relationship between the maximum cutting depth and the spindle speed of the machine tool in Step 104 to generate a frequency range for optimization. The object of Step 106 is to locate the responsive frequency range that affects the cutting ability of the machine tool, such that the structural optimization can be focused on the cutting ability.

Figure 2:
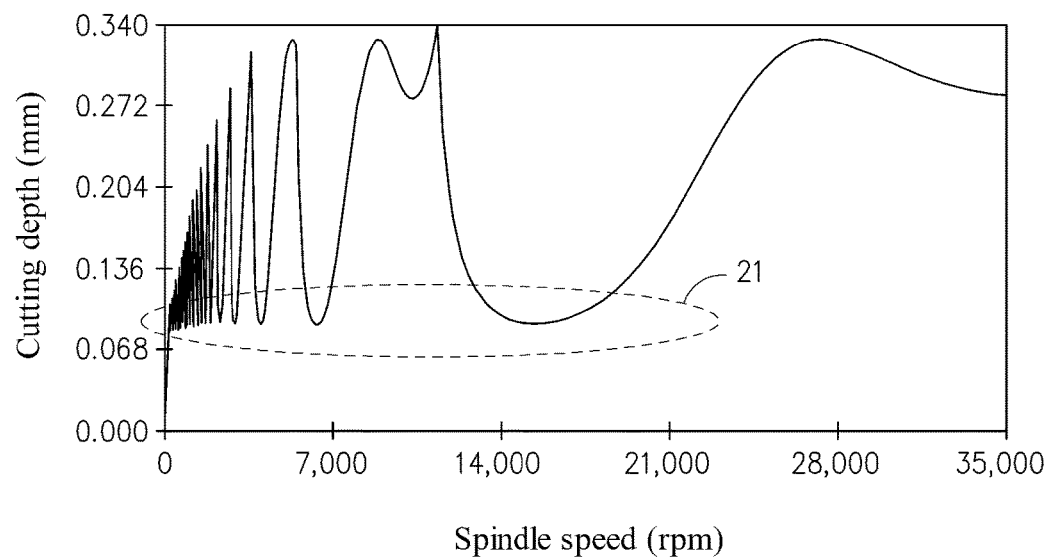
FIG. 2 is a schematic diagram of one embodiment of steady-state cuttings applied in this disclosure.
Figure 3:
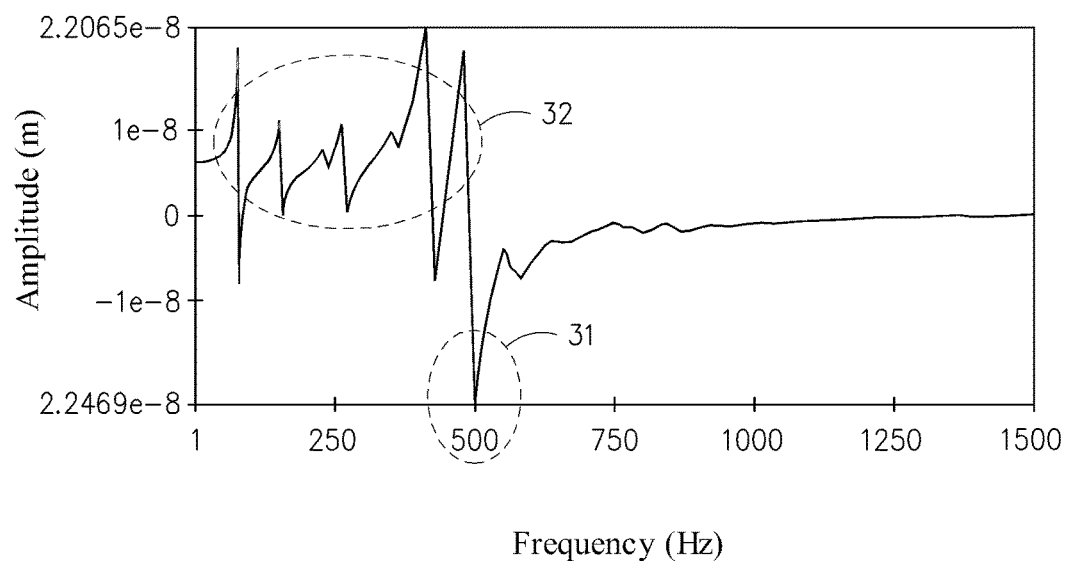
FIG. 3 is a schematic diagram of one embodiment of responsive frequencies applied in this disclosure.

By having the steady-state cutting diagram of FIG. 2 as an example, a lowest cutting depth can be located in area 21 circled by the elliptic dashed line. Further, a corresponding responsive frequency to the lowest cutting depth can be pin pointed in the responsive frequency diagram of FIG. 3, i.e. area 31 thereof. It is noted that the fluctuated curve in area 32 of FIG. 3 stands for the frequency range that is not affected in the design, and thus no optimization is needed for such a region.

Figure 4:
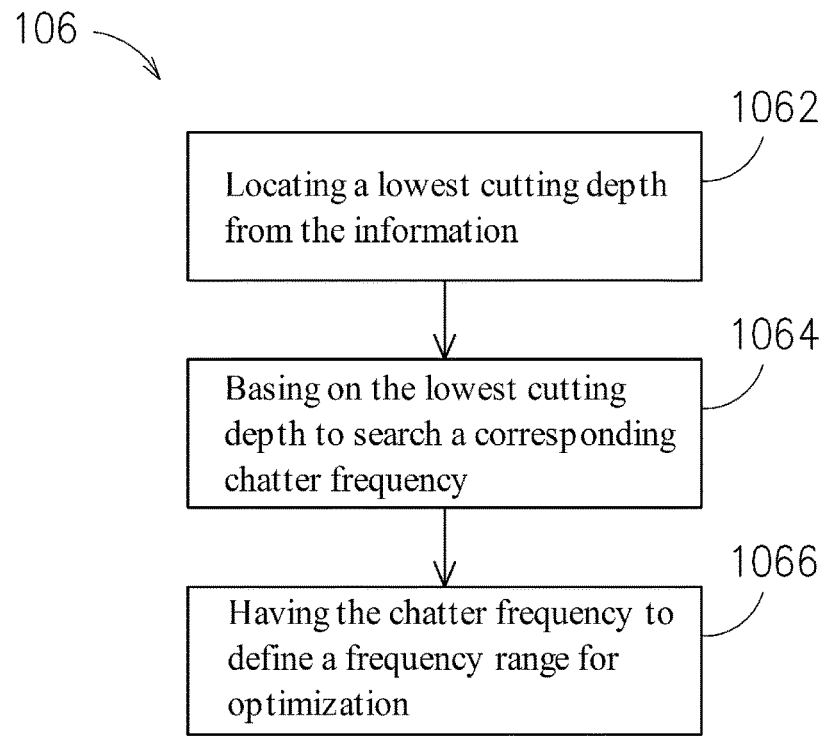
FIG. 4 is a flowchart of Step 106 of FIG. 1 in details in accordance with the present disclosure.

Accordingly, referring now to FIG. 4, aforesaid Step 106 can be further detailed by the following steps.

Step 1062: Locating the lowest cutting depth from the information;

Step 1064: Basing on the lowest cutting depth of Step 1062 to search a corresponding chatter frequency; and Step 1066: Having the chatter frequency located in Step 1064 to define a frequency range for optimization.

Step 108: Perform a structural topology optimization. Base on the frequency range for optimization defined in Step 106 and the initial configurations and the boundary conditions of the machine tool defined in Step 102 to generate an optimized model. The optimized model provided in Step 108 is then a minimized amplitude for the responsive frequency within the frequency range for optimization of Step 106.

Step 110: Determine whether the optimization fits the constraint condition. If the optimized model generated in Step 108 fits the constraint condition defined in Step 102, then end the process (Step 112). If the optimized model generated in Step 108 does not fit the constraint condition defined in Step 102, then repeat Steps 104~108 (i.e. perform an iterative for-loop design) till the optimized model generated in Step 108 can fit the constraint condition defined in Step 102.

Figure 5:
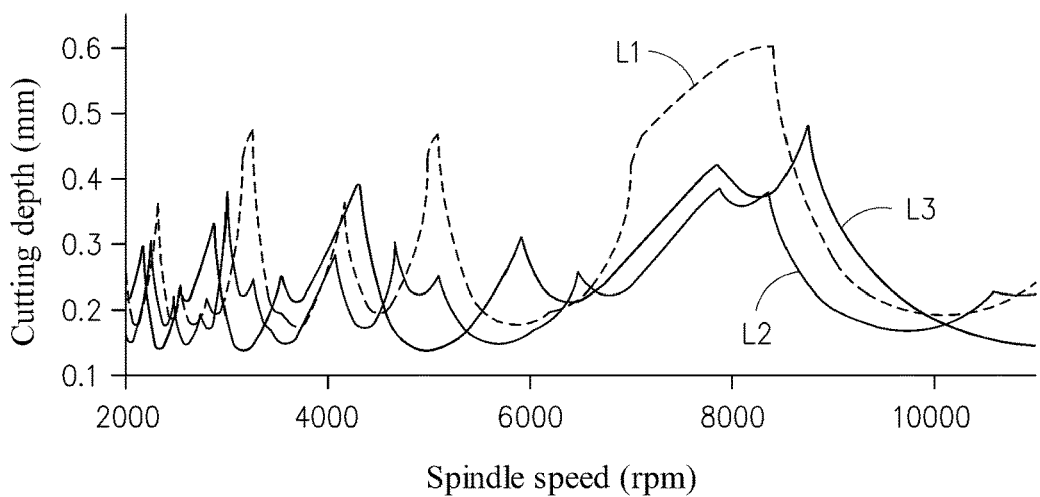
FIG. 5 demonstrates various steady-state cutting curves of the iterative for-loop design in accordance with the present disclosure.

Referring now to FIG. 5, curves L1, L2 and L3 stand for steady-state cutting curves for 50%, 40% and 30% of the structural weight, respectively. In FIG. 5, it is noted that, after the iterative for-loop design, the optimized model generated in Step 108 can fit the constraint condition defined in Step 102. While in performing the iterative for-loop design, the calculation is based on the optimized model generated by the preceding for-loop. Also, the calculations in FIG. 5 are based on the embodiment with the design conditions described in the foregoing Step 102 for the 4-blade plain cutter.

Step 112: End.

In summary, the process-orientated design method for machine tool structures provided in this disclosure is characterized on the for-loop manipulation including integrally a step of calculating cutting ability, a step of performing an optimization and a step of performing a structural topology optimization. Since the step of performing an optimization involves a precise selection of the frequency range that affects the cutting ability for optimization, thus the optimization on the structural characteristics can be transformed into the optimization on the cutting ability. In this disclosure, the dynamic stiffness topology optimization method can utilize the theoretic characteristics that the maximum amplitude of the blade tip having a real part of the flexibility responsive response less than a zero is proportional to the steady-state limit cutting to modify and integrate the steady-state limit cutting simulated technique so as to have the optimized object and constraint function to be transformed into the steady-state limit cutting. The contribution of the technique in this disclosure is to overcome the application limit of the structural topology optimization, such that the optimized object function would not be limited to be an abstract physical quantity of the structural flexibility, but to directly relate to the steady-state limit cutting of the machine tool. Thereupon, while in designing the machine tool, the machinability of the machine tool can be understood in the early stage of the topology optimization, thus possible following design changes can be minimized, and the total design time can be substantially reduced.

It shall be mentioned again is that the present disclosure includes a step of performing an Optimization to determine purposely the specific frequency range that affects the cutting ability to be optimized, and to transform the structural characteristics optimization into the cutting ability optimization. However, in the conventional technique, the method of performing a structural topology optimization and the chatter analysis method in cutting can only perform optimization upon the structural characteristics, but fail to evaluate the cutting ability in time, so that the machinability of the machine tool can't be understood and controlled in time in the early design stage.

With respect to the above description then, it is to be realized that the optimum dimensional relationships for the parts of the disclosure, to include variations in size, materials, shape, form, function and manner of operation, assembly and use, are deemed readily apparent and obvious to one skilled in the art, and all equivalent relationships to those illustrated in the drawings and described in the specification are intended to be encompassed by the present disclosure.

What is claimed is:

1. A process-orientated design method for machine tool structures, comprising the steps of:
   (A) defining design conditions, the design conditions including initial configurations for a machine tool, cutting requirements of the machine tool, boundary conditions of the machine tool, a maximum stable cutting depth under a specific speed or a specific speed range of the machine tool and a structural weight of the machine tool;
   (B) calculating cutting ability, based on the initial configurations and the cutting requirements of Step (A) to generate information of the machine tool that characterizes a relationship between a maximum cutting depth and a spindle speed of the machine tool;
   (C) performing an optimization, based on the information of Step (B) to determine a frequency range for the optimization;
   (D) performing a structural topology optimization, based on the frequency range of Step (C) and the initial configurations and the boundary conditions of Step (A) to generate an optimized model; and
   (E) determining whether the optimized model fits a constraint condition, ending the method if the optimized model of Step (D) fits the constraint condition, repeating Steps (B)~(D) if the optimized model does not fit the constraint condition of Step (A);
   wherein the optimized model of the design conditions defined in Step (A) minimizes a structural mass with respect to a steady-state cutting depth.

2. The process-orientated design method for machine tool structures of claim 1, wherein the optimized model of the design conditions defined in Step (A) maximizes a steady-state cutting depth without chatter with respect to the structural weight.

3. The process-orientated design method for machine tool structures of claim 1, wherein the Step (C) further includes the steps of:
   (C1) locating a lowest cutting depth from the information;
   (C2) basing on the lowest cutting depth of Step (C1) to search a corresponding chatter frequency; and
   (C3) having the chatter frequency located in Step (C2) to define the frequency range for optimization.

4. The process-orientated design method for machine tool structures of claim 1, wherein an optimization object of the optimized model generated in Step (D) minimizes an amplitude of a responsive frequency of the frequency range for optimization determined in Step (C).

5. A process-orientated design method for machine tool structures, comprising the steps of:
   (A) defining design conditions, the design conditions including initial configurations for a machine tool, cutting requirements of the machine tool, boundary conditions of the machine tool, a maximum stable cutting depth under a specific speed or a specific speed range of the machine tool and a structural weight of the machine tool;
   (B) calculating cutting ability, based on the initial configurations and the cutting requirements of Step (A) to generate information of the machine tool that characterizes a relationship between a maximum cutting depth and a spindle speed of the machine tool;
   (C) performing an optimization, based on the information of Step (B) to determine a frequency range for the optimization;
   (D) performing a structural topology optimization, based on the frequency range of Step (C) and the initial configurations and the boundary conditions of Step (A) to generate an optimized model; and
   (E) determining whether the optimized model fits a constraint condition, ending the method if the optimized model of Step (D) fits the constraint condition, repeating Steps (B)~(D) if the optimized model does not fit the constraint condition of Step (A);

wherein the optimized model of the design conditions defined in Step (A) maximizes a steady-state cutting depth without chatter with respect to the structural weight.

* * * * *